(12) United States Patent
Kuo et al.

(10) Patent No.: US 9,123,390 B2
(45) Date of Patent: *Sep. 1, 2015

(54) METHOD AND APPARATUS OF CHANGING DEVICE IDENTIFICATION CODES OF A MEMORY INTEGRATED CIRCUIT DEVICE

(71) Applicant: Macronix International Co., Ltd., Hsinchu (TW)

(72) Inventors: Nai-Ping Kuo, Hsinchu (TW); Kuen-Long Chang, Taipei (TW); Ken-Hui Chen, Hsinchu (TW); Ming-Chih Hsieh, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/183,315

(22) Filed: Feb. 18, 2014

(65) Prior Publication Data

US 2014/0160870 A1    Jun. 12, 2014

Related U.S. Application Data

(63) Continuation of application No. 13/052,343, filed on Mar. 21, 2011, now Pat. No. 8,687,438.

(51) Int. Cl.
G11C 7/00 (2006.01)
G11C 7/22 (2006.01)
G11C 7/10 (2006.01)
G11C 7/20 (2006.01)

(52) U.S. Cl.
CPC .. G11C 7/00 (2013.01); G11C 7/10 (2013.01); G11C 7/20 (2013.01)

(58) Field of Classification Search
CPC ............... G11C 7/00; G11C 7/10; G11C 7/20
USPC ................. 365/189.16, 189.011, 45; 235/435
See application file for complete search history.

(56) References Cited

U.S. PATENT DOCUMENTS

| | | | |
|---|---|---|---|
| 4,451,903 A | 5/1984 | Jordan | |
| 6,598,217 B1 | 7/2003 | Fujikawa | |
| 7,046,536 B2 | 5/2006 | Roohparvar | |
| 7,471,535 B2 | 12/2008 | Roohparvar | |
| 7,539,896 B2 | 5/2009 | Lakhani et al. | |
| 7,546,498 B1 | 6/2009 | Tang et al. | |
| 8,687,438 B2 | 4/2014 | Kuo et al. | |
| 2008/0245864 A1 | 10/2008 | Hayashi | |
| 2012/0002479 A1* | 1/2012 | Febbrarino et al. | 365/185.18 |

* cited by examiner

*Primary Examiner* — Toan Le
(74) *Attorney, Agent, or Firm* — Kenta Suzue; Haynes Beffel & Wolfeld LLP (57) ABSTRACT

In the disclosed technology, the device identification code of a memory integrated circuit is changeable. In some cases, multiple device identification codes are stored on the memory integrated circuit, and multiple device identification code selection data are stored on the memory integrated circuit. A device identification code register can store a selected device identification code.

12 Claims, 9 Drawing Sheets

METHOD AND APPARATUS OF CHANGING DEVICE IDENTIFICATION CODES OF A MEMORY INTEGRATED CIRCUIT DEVICE

RELATED APPLICATION

This application is a continuation of U.S. patent application Ser. No. 13/052,343, filed 21 Mar. 2011 and is incorporated herein by reference.

BACKGROUND

1. Field of the Invention

This technology relates to a programmable identification code of an integrated circuit device.

2. Description of Related Art

Each memory device has an identification code to represent its memory type, density, manufacture, or even other important parameters which need to be recognized by the system. Typically the identification codes are saved by anti-fuses and unchangeable. If the memory device is replaced by another supplier or different type, the system or controller may fail, because the system or controller expects the identification code of the old replaced memory. This presents an obstacle to replacement of the memory device with another of a different type and/or a different supplier. For example, updating the hardware and or software of the system or controller with new recognition ability is time costly and time-consuming.

SUMMARY

One aspect of the technology is an integrated circuit memory device. The integrated circuit memory device includes an integrated circuit substrate, a plurality of device identification memory cells on the semiconductor substrate, a plurality of device identification selection memory cells on the semiconductor substrate, and control circuitry.

The control circuitry (i) operates a plurality of device identification codes with the plurality of device identification memory cells, the plurality of device identification codes including a plurality of bits identifying a type of the integrated circuit memory device, and (ii) operates with selection data with the plurality of device identification selection memory cells, the selection data distinguishing from among the plurality of device identification codes.

In one embodiment, the control circuitry, responsive to a device identification code read instruction, reads a device identification code from the plurality of device identification memory cells, the device identification code distinguished from other device identification codes of the plurality of device identification memory cells by the selection data of the plurality of device identification selection memory cells.

In one embodiment, the type of the integrated circuit memory device identified by a device identification code of the plurality of device identification codes, includes a manufacturer identification of the integrated circuit memory device.

In one embodiment, the type of the integrated circuit memory device identified by a device identification code of the plurality of device identification codes, includes fabrication data of the integrated circuit memory device.

In one embodiment, the type of the integrated circuit memory device identified by a device identification code of the plurality of device identification codes, includes product specification data of the integrated circuit memory device.

One aspect of the technology is a method of replacing an integrated circuit memory device in an application, comprising:

providing a system configured for compatibility with a first integrated circuit memory device type having a first device identification code;

providing a second integrated circuit memory device type without the first device identification code;

configuring the second integrated circuit memory device type to have said at least part of the first device identification code; and combining the second integrated circuit memory device type with the system.

In one embodiment said configuring includes:

programming a plurality of device identification memory cells on the second integrated circuit memory device type with said at least part of the first device identification code, such that the read device identification code operation on the second integrated circuit memory device type reads said at least part of the first device identification code from the plurality of device identification memory cells.

In one embodiment said configuring includes:

programming a plurality of device identification selection memory cells on the second integrated circuit memory device type with selection data distinguishing said at least part of the first device identification code from among a plurality of device identification codes on the second integrated circuit memory device type, such that the read device identification code operation on the second integrated circuit memory device type reads said at least part of the first device identification code from the plurality of device identification memory cells.

In one embodiment said configuring includes:

programming a plurality of device identification memory cells on the second integrated circuit memory device type with said at least part of the first device identification code, such that the read device identification code operation on the second integrated circuit memory device type returns to the system said at least part of the first device identification code from the plurality of device identification memory cells.

In one embodiment said configuring includes:

programming a plurality of device identification selection memory cells on the second integrated circuit memory device type with selection data distinguishing said at least part of the first device identification code from among a plurality of device identification codes on the second integrated circuit memory device type, such that the read device identification code operation on the second integrated circuit memory device type returns to the system said at least part of the first device identification code from the plurality of device identification memory cells.

In one embodiment, prior to said configuring, the read device identification code operation on the second integrated circuit memory device type fails to return said at least part of the first device identification code.

In one embodiment, prior to said configuring, the second integrated circuit memory device type without the first device identification code is incompatible with the system.

In one embodiment, after said configuring, the read device identification code operation on the second integrated circuit memory device type succeeds in returning said at least part the first device identification code.

In one embodiment, after said configuring, the second integrated circuit memory device type is compatible with the system.

In one embodiment, the first device identification code includes a manufacturer identification of the integrated circuit memory device.

In one embodiment, the first device identification code includes fabrication data of the integrated circuit memory device.

In one embodiment, the first device identification code includes product specification data of the integrated circuit memory device.

One aspect of the technology is a method of manufacturing an integrated circuit memory device, comprising:
providing an integrated circuit substrate;
providing a plurality of application memory cells on the semiconductor substrate;
providing a plurality of device identification memory cells on the semiconductor substrate;
providing a plurality of device identification selection memory cells on the semiconductor substrate; and
providing control circuitry that (i) programs, erases, and reads application data with the plurality of application memory cells, (ii) programs, erases, and reads a plurality of device identification codes with the plurality of device identification memory cells, the plurality of device identification codes including a plurality of bits identifying a type of the integrated circuit memory device, and (iii) programs, erases, and reads selection data with the plurality of device identification selection memory cells, the selection data distinguishing from among the plurality of device identification codes.

In one embodiment, the control circuitry, responsive to a device identification code read instruction, reads a device identification code from the plurality of device identification memory cells, the device identification code distinguished from other device identification codes of the plurality of device identification memory cells by the selection data of the plurality of device identification selection memory cells.

In one embodiment, the type of the integrated circuit memory device identified by a device identification code of the plurality of device identification codes, includes a manufacturer identification of the integrated circuit memory device.

In one embodiment, the type of the integrated circuit memory device identified by a device identification code of the plurality of device identification codes, includes fabrication data of the integrated circuit memory device.

In one embodiment, the type of the integrated circuit memory device identified by a device identification code of the plurality of device identification codes, includes product specification data of the integrated circuit memory device.

In various embodiments, the various memory cells are nonvolatile and/or volatile.

DETAILED DESCRIPTION

A nonvolatile memory cell (such as a flash memory device) stores data without losing data, even upon power down. Various embodiments utilize nonvolatile memory cells to store the identification codes, and can be updated by program or erase such as array data. In this way, the memory identification codes are programmable and flexible to adjust to different systems that expect different memory identification codes. Otherwise, the different systems may require disruptive and expensive changes to accommodate a new identification code of a different memory device.

Figure 1A:
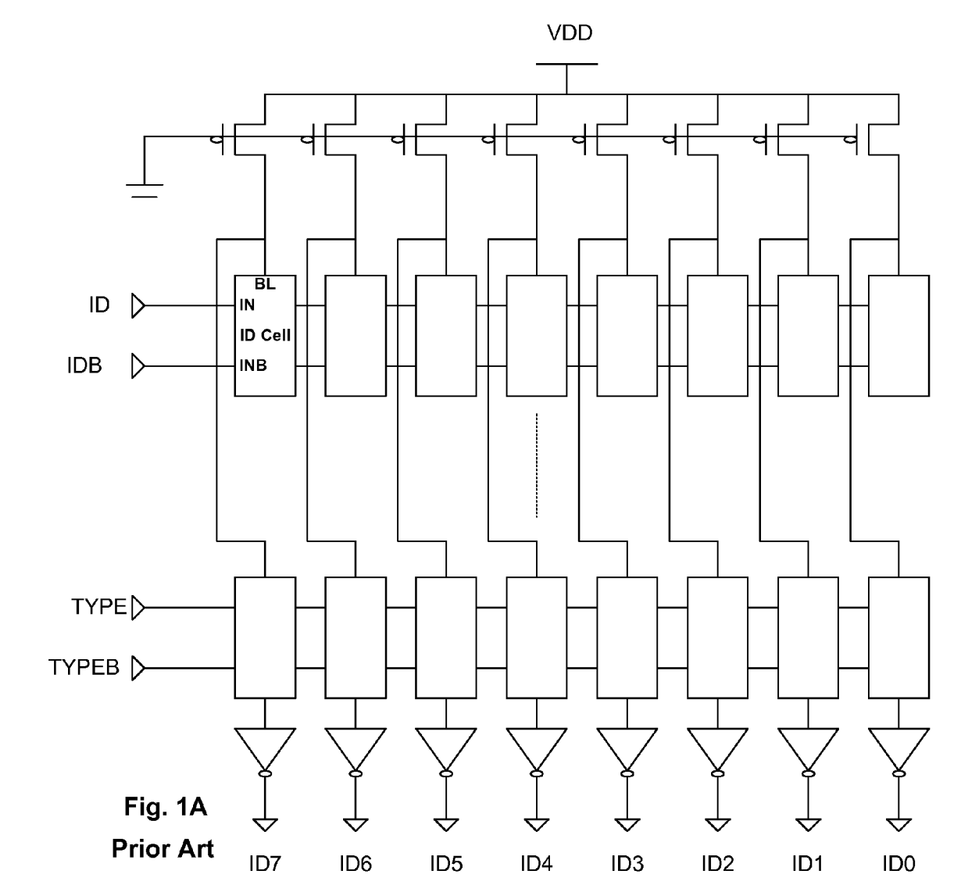
FIGS. 1A and 1B shows a typical memory identification code circuit implementation.
Figure 1B:
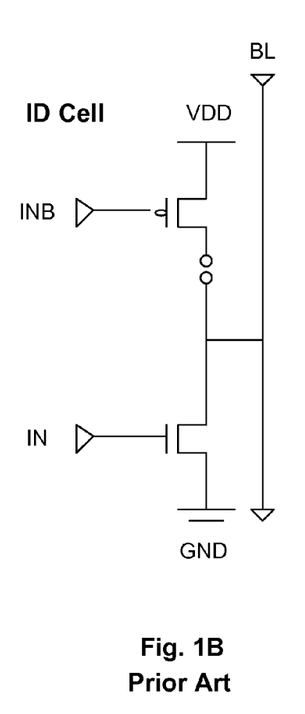

FIGS. 1A and 1B shows a typical memory identification code circuit implementation. In FIG. 1A, an identification memory cell is repeated in an array structure, and output data in byte mode or word mode. A more detailed picture of the identification memory cell is shown in FIG. 1B, and includes transistors which rely on a metal layer connection to pull down the output bit line BL to ground (gnd) through the NMOS transistor, or alternatively keep the output bit line BL at supply voltage (vdd) through the PMOS transistor which weakly pulls high. Accordingly, the identification code of a memory device can be changed by modifying the metal layer of the memory device. However, this implementation is inflexible, due to the required metal layer mask change for different memory device identification codes, and the requirement of determining the memory device identification code during fabrication (and inability to change the memory device identification code after fabrication).

Figure 2A:
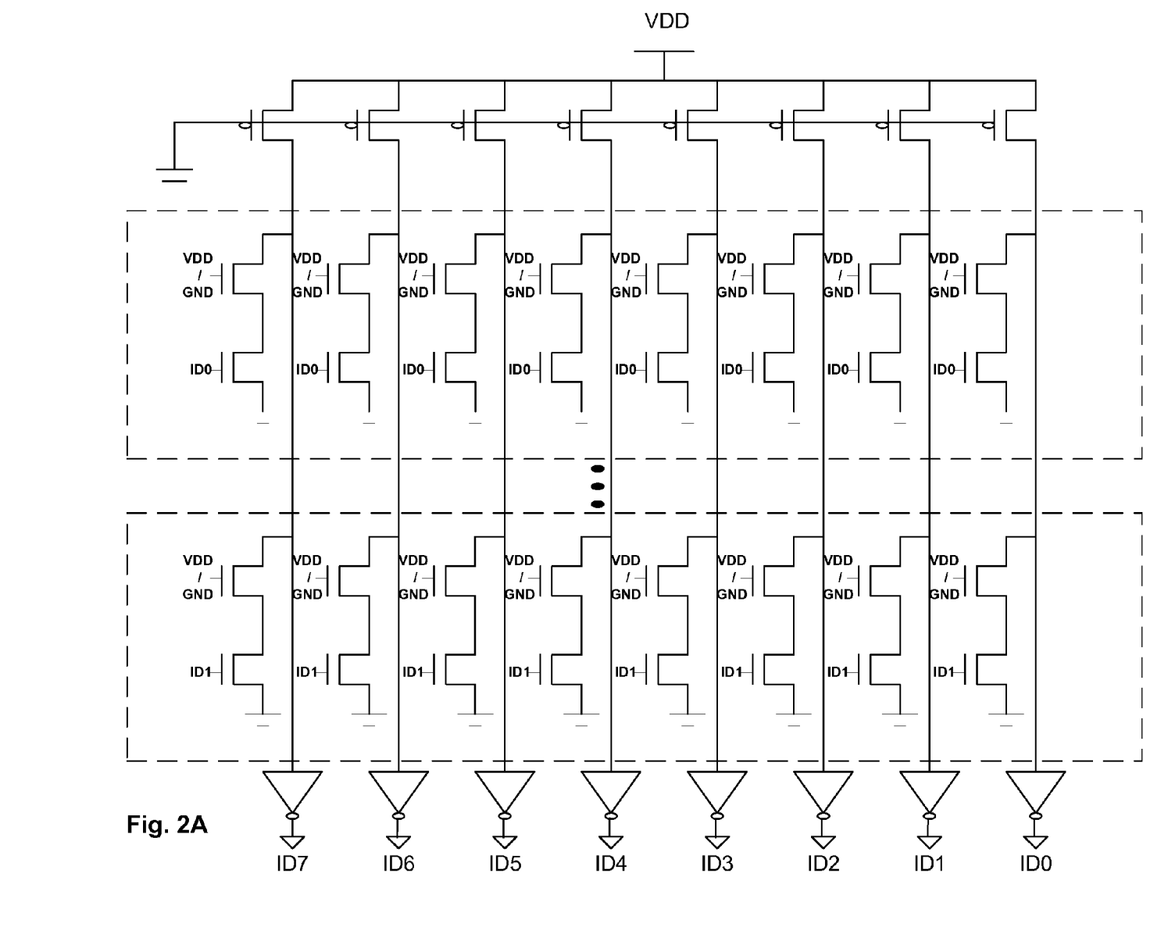
FIGS. 2A and 2B are respectively schematic and flow chart illustrations showing various embodiments of a memory identification code circuit implementation.

FIGS. 2A and 2B are respectively schematic and flow chart illustrations showing various embodiments. In FIG. 2A, each memory device identification code bit has serially connected pull down NMOS transistors, with each NMOS transistor in the series for a particular bit position being selected by the same particular bit position of the different memory device identification code selections. The upper row of NMOS transistors reads all the bit positions of the memory device identification code ID0, and the lower row of NMOS transistors reads all the bit positions of the memory device identification code ID1. For example, the leftmost serially connected pull down NMOS transistors correspond to output memory device identification code bit ID7, and within the series, the upper NMOS transistor is selected by bit position ID7 of a memory device identification code ID0, and the lower NMOS transistor is selected by bit position ID7 of another memory device identification code ID1. The dots between the upper row of NMOS transistors and the lower row of NMOS transistors indicate that, in various embodiments, the circuitry can be customized to have a particular number of memory device identification codes, i.e. a different number of rows. Also, circuitry can be customized to have a particular number of bit positions within each memory device identification code, i.e. a different number of columns.

Figure 2B:
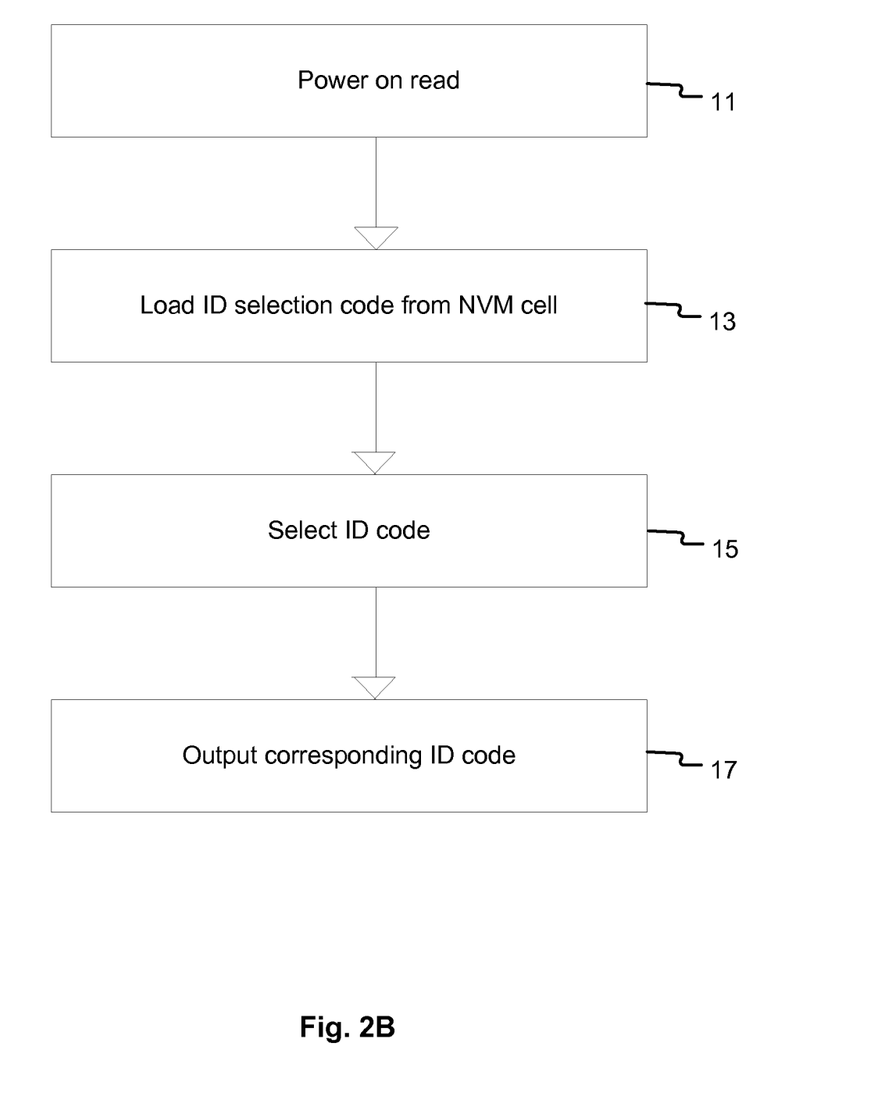

The different memory device identification code selections are stored in nonvolatile memory and loaded into registers during power on read. If, for a particular bit position, any memory device identification code (such as the memory device ID0 code or ID1 code) is logic high, then the pull down transistor path is active for that bit position. In this way, an integrated circuit can output a selected one of multiple memory device identification codes according to one or more memory device identification code selection bits stored in one or more non-volatile memory cells. FIG. 2B shows the flowchart of the process of loading a memory device identification selection code, and then the memory device identification code selected by the memory device identification selection code, during power on read. Following power on read at 11, the memory device identification selection code is loaded from nonvolatile memory cells at 13. The memory device identification selection code is used to select one of multiple memory device identification codes at 15. Then the selected memory device identification selection code is output at 17.

Figure 3A:
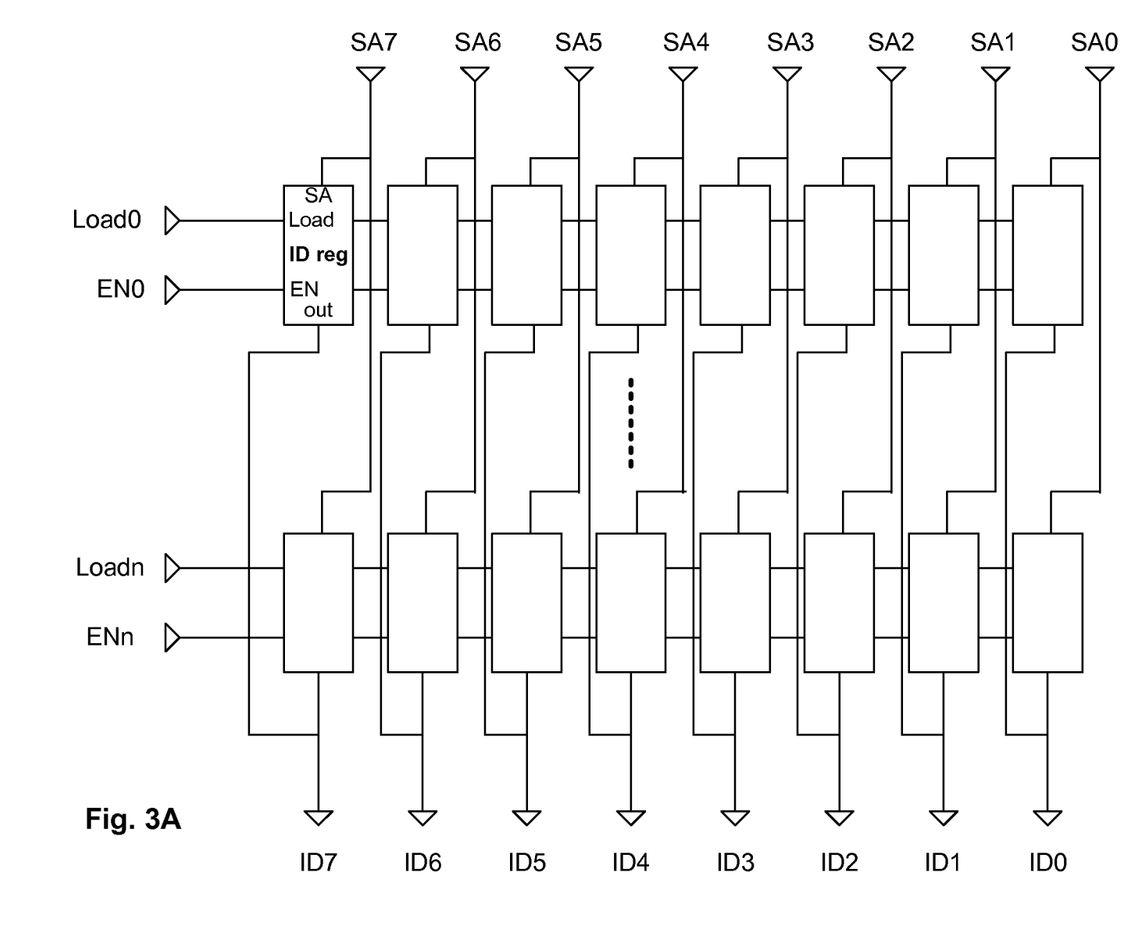
FIGS. 3A and 3B are schematic illustrations showing other embodiments of a memory identification code circuit implementation.
Figure 3B:
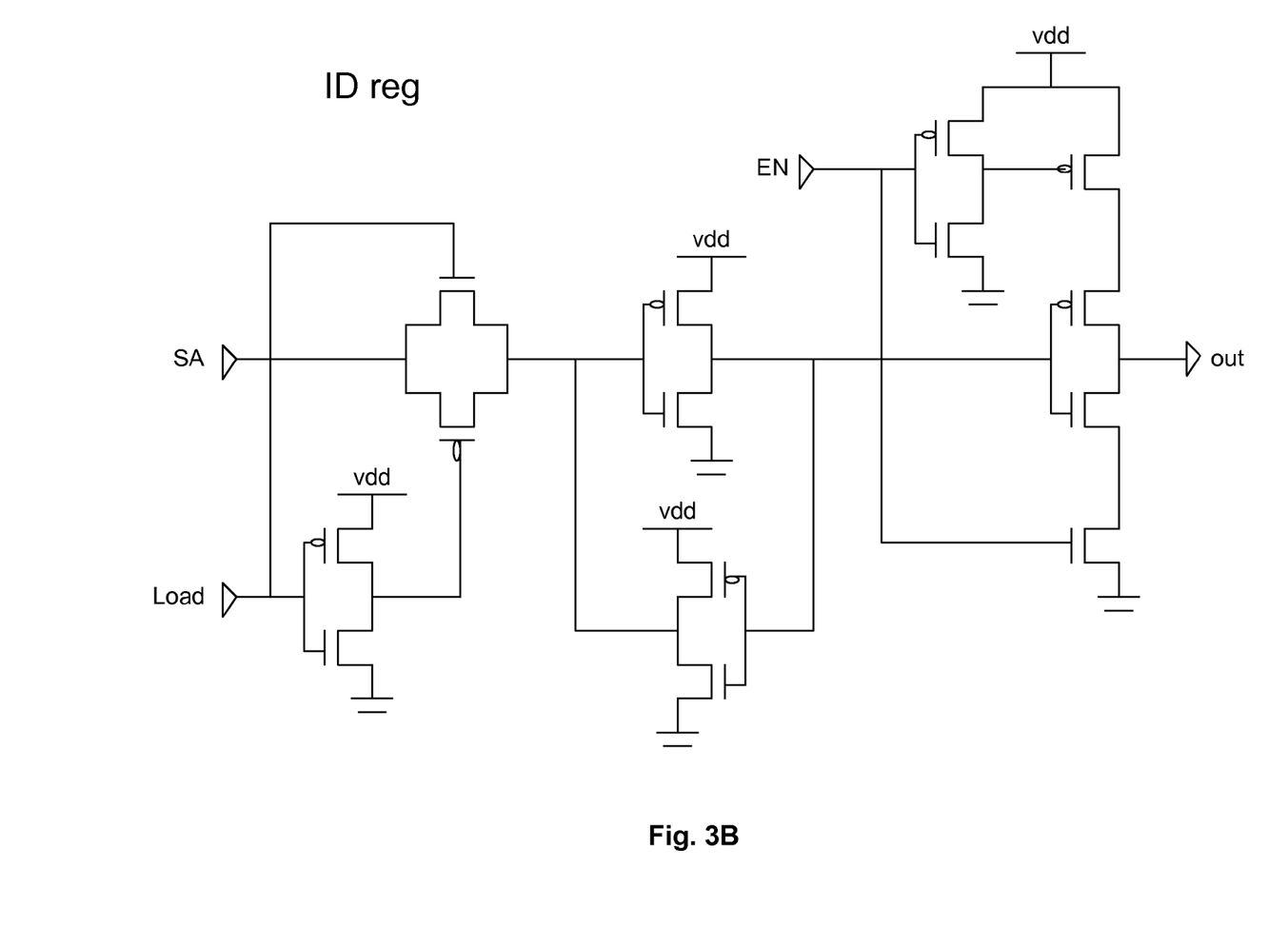

FIGS. 3A and 3B are schematic illustrations showing other embodiments. FIG. 3A is memory device identification code register array structure. The registers of different memory device identification codes are enabled by the different enable signals (EN#) and output to the data bus ID0~ID7, while the registers of other memory device identification codes that do not receive the enable signal remain inactive. FIG. 3B shows an example unit identification register which has a "Load" signal to latch the memory device identification code read from nonvolatile memory cells and the enable "EN" signal to set the latch active. Due to the memory device identification code being stored in and loaded from nonvolatile memory cells, the memory device identification code can be modified by programming or erasing the memory cell.

Figure 4:
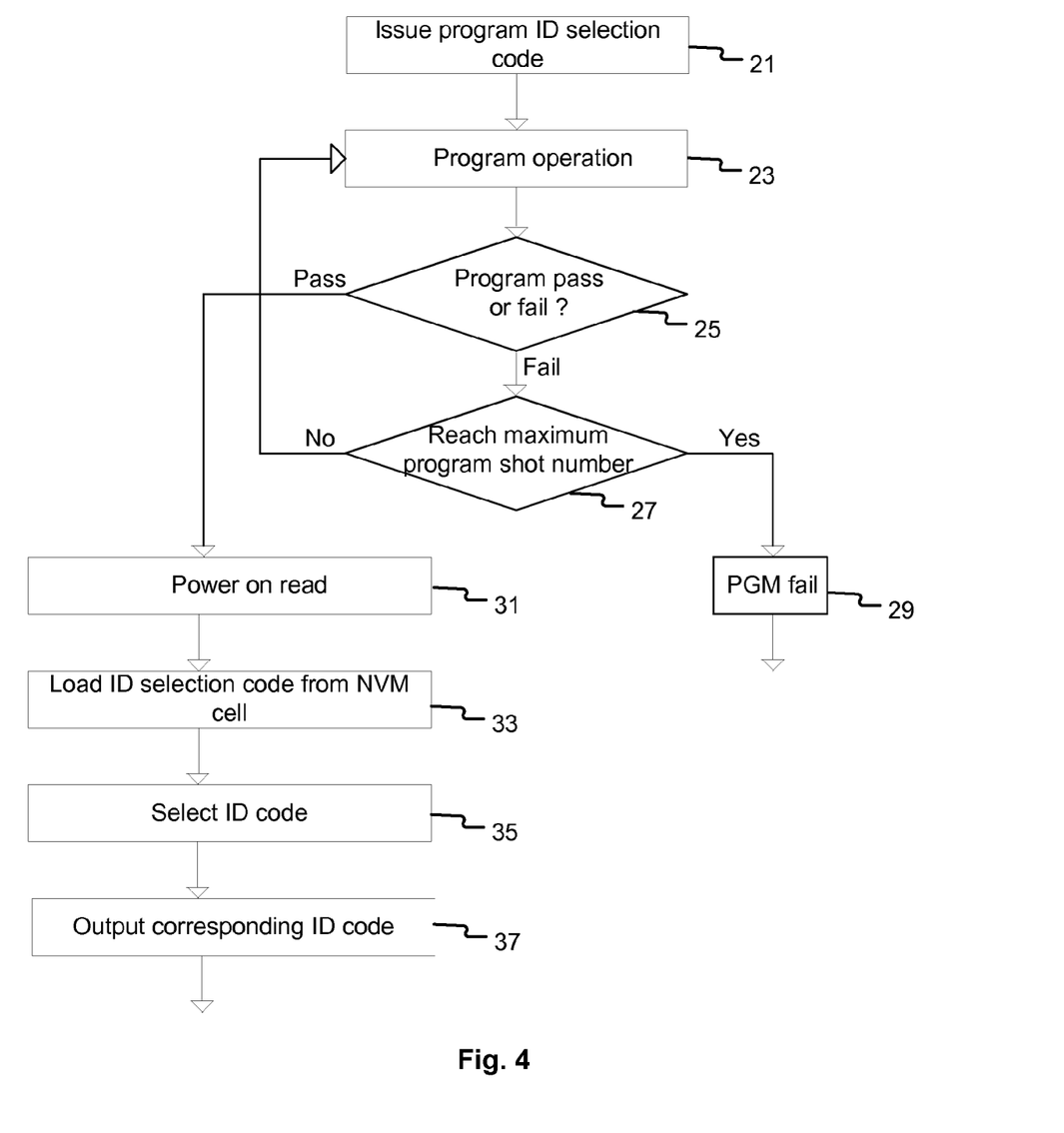
FIG. 4 shows a flow chart of how to reload and update the memory device identification code selection bit(s).

FIG. 4 shows a flow chart of how to reload and update the memory device identification code selection bit(s). A memory device identification selection code to be programmed is issued at 21. The program operation to program the memory device identification selection code begins at 23. Program pass or fail is determined, via a verify procedure at 25. If program fail is determined, then it is determined whether the maximum program shot number is reached at 27. If the maximum program shot number is not reached, then the program operation is repeated at 23. If the maximum program shot number is reached, then the program operation fails at 29. If program pass is determined at 25, then the algorithm proceeds with power on read at 31. The memory device identification selection code is loaded from nonvolatile memory cell(s) at 33. With the memory device identification selection code, a memory device identification code is selected at 35. The memory device identification code distinguished by the memory device identification selection code is output at 37.

Figure 5:
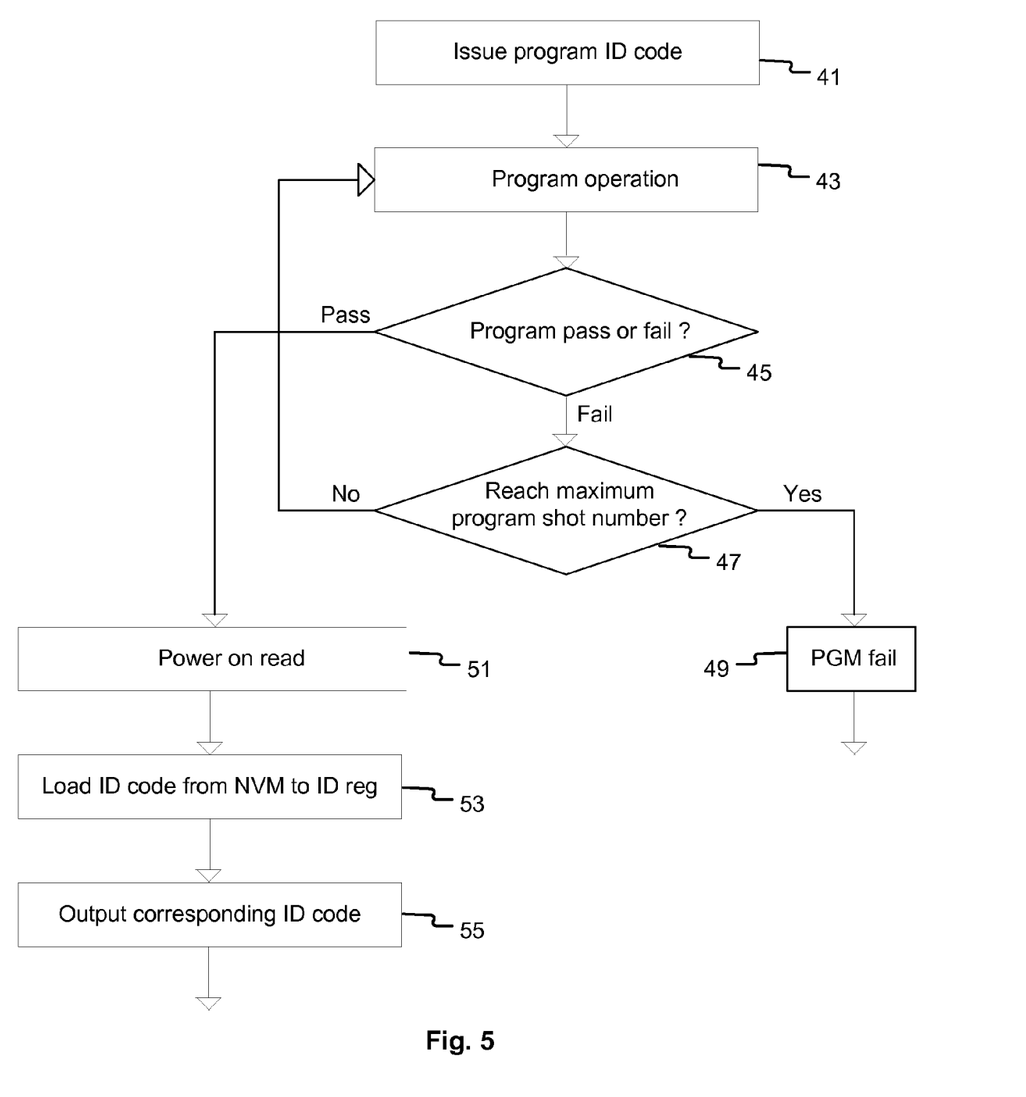
FIG. 5 shows a flow chart of how to reload and update memory device identification code bit(s).

FIG. 5 shows a flow chart of how to reload and update memory device identification code bit(s). A memory device identification code to be programmed is issued at 41. The program operation to program the memory device identification code begins at 43. Program pass or fail is determined, via a verify procedure at 45. If program fail is determined, then it is determined whether the maximum program shot number is reached at 47. If the maximum program shot number is not reached, then the program operation is repeated at 43. If the maximum program shot number is reached, then the program operation fails at 49. If program pass is determined at 45, then the algorithm proceeds with power on read at 51. The memory device identification selection code is loaded from nonvolatile memory cell(s) at 53. The memory device identification code is output at 55.

Figure 6:
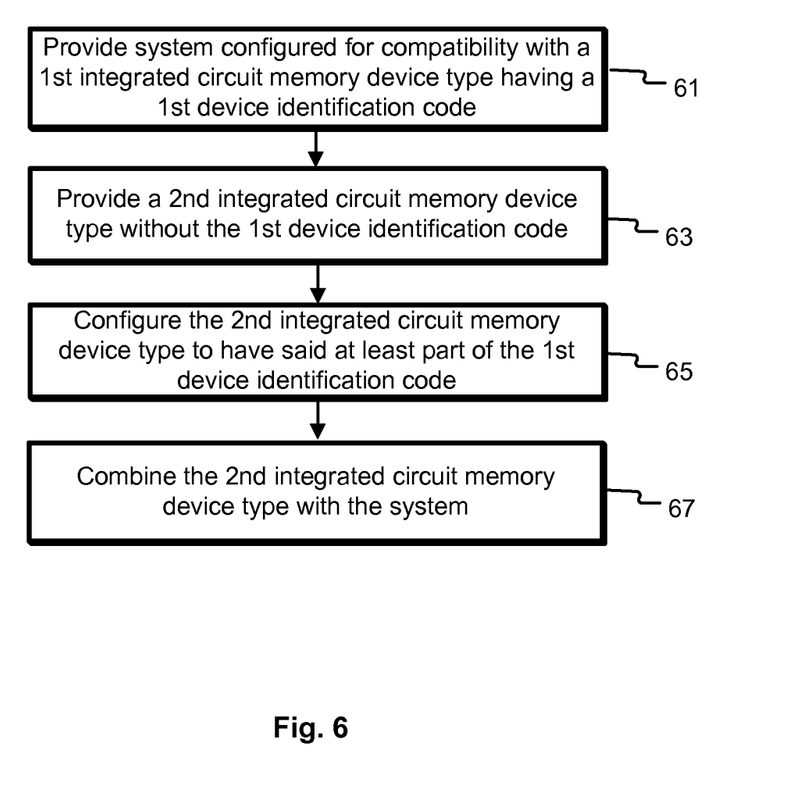
FIG. 6 shows an example application of the changeable memory device identification selection code and the changeable memory device identification code.

FIG. 6 shows an example application of the changeable memory device identification selection code and the changeable memory device identification code. A system is provided that is configured for compatibility with a $1^{st}$ integrated circuit memory device type having a $1^{st}$ device identification code at 61. Examples of compatibility are that, the system queries the $1^{st}$ integrated circuit memory device type, and upon receiving the $1^{st}$ device identification code from the $1^{st}$ integrated circuit memory device type, the system proceeds with regular operation. A $2^{nd}$ integrated circuit memory device type is provided without the $1^{st}$ device identification code at 63. Because, at this point, the $2^{nd}$ integrated circuit memory device type lacks the $1^{st}$ device identification code, the system is not configured for compatibility with the $2^{nd}$ integrated circuit memory device type. The system may even be inoperable because of this lack of compatibility. For example, the system may be configured to halt regular operation, if a query to the $2^{nd}$ integrated circuit type by the system fails to return the $1^{st}$ device identification code as expected. Without the presently described technology, such a system would have to be modified and updated to accept the different memory device identification code natively associated with the $2^{nd}$ integrated circuit memory device type. The $2^{nd}$ integrated circuit memory device type is configured to have at least part of the $1^{st}$ memory device identification code—minimally, at least the part of the $1^{st}$ memory device identification code expected by the system to continue with regular operation—at 65. Such configuration refers to updating the changeable memory device identification selection code and/or the changeable memory device identification code of the $2^{nd}$ integrated circuit memory device type. The $2^{nd}$ integrated circuit memory device type is combined with the system at 67. Such combination can occur before or after the configuration of the $2^{nd}$ integrated circuit memory device type.

Figure 7:
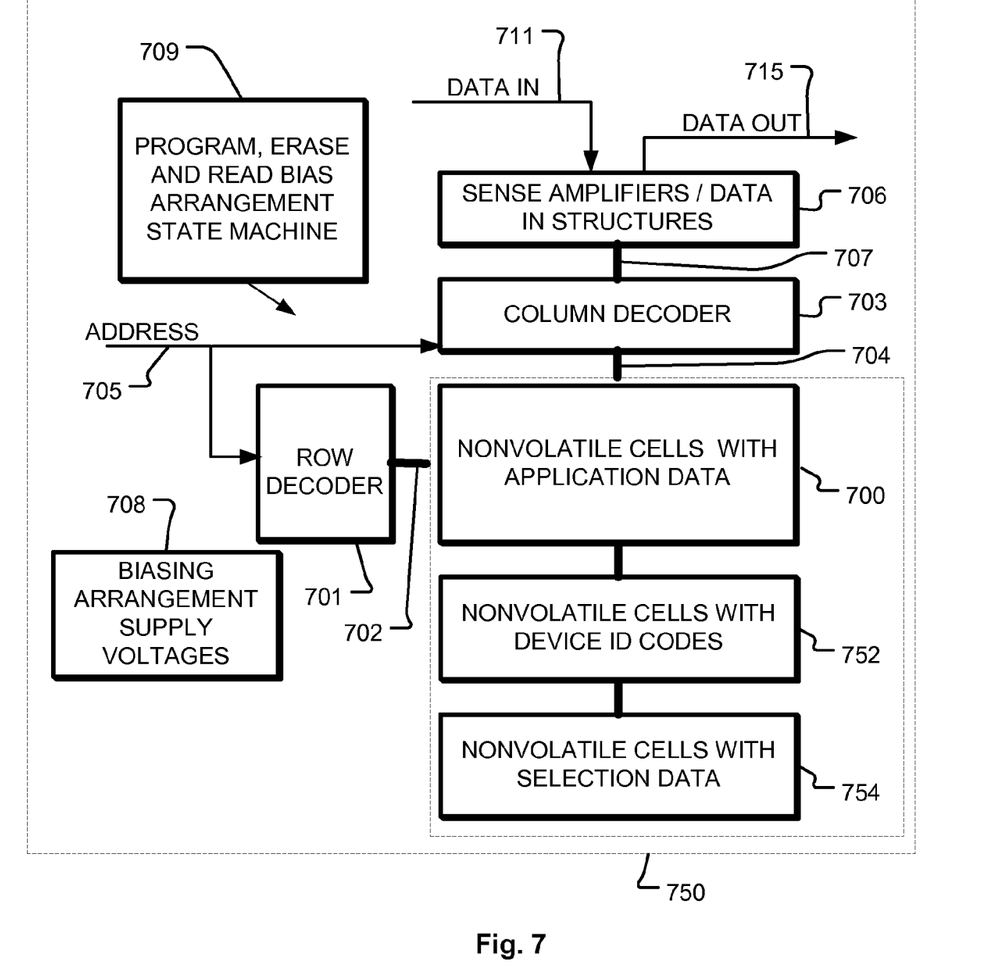
FIG. 7 is a simplified block diagram of an integrated circuit according to an embodiment of the present invention.

FIG. 7 is a simplified block diagram of an integrated circuit according to an embodiment of the present invention. The integrated circuit line 750 includes a nonvolatile memory cells with application data 700, nonvolatile memory cells with device identification codes 752, and nonvolatile memory cells with selection data 754, implemented as described herein, on one or more memory arrays. A row decoder 701 is coupled to a plurality of word lines 702, and arranged along rows in the memory array. A column decoder 703 is coupled to a plurality of bit lines 704 arranged along columns for reading and programming data from the memory cells in the array. Addresses are supplied on bus 705 to column decoder 703 and row decoder 701. Sense amplifiers and data-in structures in block 706 are coupled to the column decoder 703 in this example via data bus 707. Data is supplied via the data-in line 711 from input/output ports on the integrated circuit 750 or from other data sources internal or external to the integrated circuit 750, to the data-in structures in block 706. A controller implemented in this example using bias arrangement state machine 709 controls the application of bias arrangement supply voltage generated or provided through the voltage supply or supplies in block 708, such as read, erase, program, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Various embodiments use different forms of memory device parameters such as identification codes, types, densities, specifications, and so on The programmable identification code method and apparatus according to the invention is not restricted to the application to the memory, and may also be applied to any other circuit which provides information with flexible contents.

Besides non-volatile memory cells, fuses or metal layer optional connections also can be used. The storage element can be any type of medium such as a memory cell, fuse, and metal layer connection option.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims. What is claimed is:

The invention claimed is:

1. An integrated circuit memory device, comprising:
 a device identification code register storing a selected device identification code;
 a plurality of device identification memory cells storing the plurality of device identification codes, different ones of the plurality of device identification codes identifying different types of the integrated circuit memory device;
 a plurality of device identification selection memory cells storing selection data; and
 control circuitry that (i) uses the selection data to distinguish a selected device identification code from the plurality of device identification codes, and (ii) provides the selected device identification code to the device identification code register, the selected device identification code including a plurality of bits identifying a type of the integrated circuit memory device.

2. The device of claim 1, wherein the control circuitry, responsive to a power-on of the integrated circuit memory device, (i) uses the selection data to distinguish a selected device identification code from the plurality of device identification codes, and (ii) provides the selected device identification code to the device identification code register, the selected device identification code including a plurality of bits identifying a type of the integrated circuit memory device.

3. The device of claim 1, wherein the control circuitry, responsive to a device identification code read instruction, reads a device identification code from the plurality of device identification memory cells, the device identification code distinguished from other device identification codes of the plurality of device identification memory cells by the selection data of the plurality of device identification selection memory cells.

4. The device of claim 1, wherein the type of the integrated circuit memory device identified by a device identification code of the plurality of device identification codes, includes a manufacturer identification of the integrated circuit memory device.

5. The device of claim 1, wherein the type of the integrated circuit memory device identified by a device identification code of the plurality of device identification codes, includes fabrication data of the integrated circuit memory device.

6. The device of claim 1, wherein the type of the integrated circuit memory device identified by a device identification code of the plurality of device identification codes, includes product specification data of the integrated circuit memory device.

7. A method of operating an integrated circuit memory device, comprising:
 using selection data in the integrated circuit memory device to distinguish a selected device identification code from a plurality of device identification codes stored on the integrated circuit memory device; and
 providing the selected device identification code from device identification memory on the integrated circuit memory device to a device identification code register on the integrated circuit memory device.

8. The method of claim 7, wherein said using the selection data and said providing the selected device identification code, are responsive to a power-on of the integrated circuit memory device.

9. The method of claim 7, wherein the selected device identification code includes a manufacturer identification of the integrated circuit memory device.

10. The method of claim 7, wherein the selected device identification code includes fabrication data of the integrated circuit memory device.

11. The method of claim 7, wherein the selected device identification code includes product specification data of the integrated circuit memory device.

12. The method of claim 7, further comprising,
 responsive to a device identification code read instruction, reading the selected device identification code from the device identification code register, and providing the selected device identification code to an output of the integrated circuit memory device.

* * * * *